(12) United States Patent
Coker et al.

(10) Patent No.: US 7,163,752 B2
(45) Date of Patent: Jan. 16, 2007

(54) SHIELDED SYSTEM WITH A HOUSING HAVING A HIGH ATOMIC NUMBER METAL COATING APPLIED BY THERMAL SPRAY TECHNIQUE

(75) Inventors: J. Edward Coker, Trabuco, CA (US); Michael G. Prlina, San Bernardino, CA (US)

(73) Assignee: The Boeing Company, Chicago, IL (US)

( * ) Notice: Subject to any disclaimer, the term of this patent is extended or adjusted under 35 U.S.C. 154(b) by 255 days.

(21) Appl. No.: 10/325,989

(22) Filed: Dec. 19, 2002

(65) Prior Publication Data

US 2004/0121194 A1   Jun. 24, 2004

(51) Int. Cl.
*B32B 15/00* (2006.01)
(52) U.S. Cl. ..................................... 428/615
(58) Field of Classification Search ............... 428/937, 428/650–652, 469, 643, 645, 660–665, 615; 250/506.1, 515.1, 517.1, 518.1, 519.1, 505.1; 174/35 MS, 35
See application file for complete search history.

(56) References Cited

U.S. PATENT DOCUMENTS

| 4,235,943 | A | 11/1980 | McComas et al. |
| 4,529,616 | A | 7/1985 | Smythe |
| 4,833,334 | A * | 5/1989 | Valy et al. ................ 250/515.1 |
| 5,682,596 | A | 10/1997 | Taylor et al. |
| 5,915,743 | A | 6/1999 | Palma |
| 6,245,390 | B1 | 6/2001 | Baranovski et al. |
| 6,455,864 | B1 * | 9/2002 | Featherby et al. ........ 250/515.1 |
| 6,605,818 | B1 * | 8/2003 | Cornog et al. ........... 250/518.1 |
| 2001/0001042 | A1 | 5/2001 | Sinatra et al. |

OTHER PUBLICATIONS

High Velocity Oxy-Fuel Thermal Spray; from website http://p2library.nfesc.navy.mil/P2_Opportunity_Handbook/1_3.html; May 21, 2002; 5 pgs.
Sandia National Laboratories; from website http://www.sandia.gov/materials/sciences/factsheets/SprayCoating.html; Aug. 23, 2002; 3 pgs.

* cited by examiner

*Primary Examiner*—Jennifer C. McNeil
*Assistant Examiner*—Daniel Miller
(74) *Attorney, Agent, or Firm*—Alston & Bird LLP

(57) ABSTRACT

A radiation-shielded system and method of producing a radiation-shielded system having at least one component susceptible to disruption upon exposure to ionizing radiation, wherein the susceptible component is protected by a rigid housing having a metallic layer of high atomic number that is deposited on the surface of the housing using a thermal spray technique.

27 Claims, 3 Drawing Sheets

SHIELDED SYSTEM WITH A HOUSING HAVING A HIGH ATOMIC NUMBER METAL COATING APPLIED BY THERMAL SPRAY TECHNIQUE

FIELD OF THE INVENTION

The invention relates to a system and method for shielding components that are susceptible to damage from external ionizing radiation. Particularly, the invention provides a system and method of shielding an electronic, organic, or micro-mechanical component from external ionizing radiation with a housing where the housing is coated with a metal layer of high atomic number. Further, the invention relates to a radiation-shielded system with a housing having a high atomic number metal layer deposited by a thermal spray technique.

BACKGROUND OF THE INVENTION

Many of today's military, space, and commercial electronics designs are required to operate in hostile man-made or natural radiation environments, and in certain extreme cases, a combination of both. Exposure of electronics to ionizing radiation environments can result in catastrophic damage, reduced operating lifetimes, and loss of critical data unless physical protection is utilized to protect the circuitry.

Like electronics, other components that may be maintained onboard vehicles or housed in stationary locations are subject to damage or disruption by ionizing radiation. These include but are not limited to living organisms, micro-mechanical devices, and magnetic, optical, electronic, or organic memory systems.

Steps that are employed during design and production of electronic systems and, to some extent, organic, micro-mechanical, and various memory systems in order to protect those systems from unwanted environmental influences are known as system hardening practices. A key aspect of systems hardening is the attenuation of external ionizing radiation sources by virtue of dedicated radiation shielding. Through a combination of shield material mass, density, and thickness, external ionizing radiation environments may be reduced by several orders of magnitude, thereby reducing the possibility of damage to radiation-susceptible systems.

Housings for electronic and other equipment aboard air, space, and ground vehicles are most often designed with the primary considerations of space and weight limitations. In particular, housings for electronics which must be closely packed within physical structures are often shaped and sized to most efficiently match the structure in or on which the electronics are mounted. Further, housings for electronics used on aircraft and spacecraft are designed to be as lightweight as possible with the thickness, size, and density of the housing only as large as is necessary for structural or thermal protection of the electronics.

Because housings for electronics and other components that may be susceptible to damage from ionizing radiation are not are typically designed with weight and size considerations in mind, they are not often well suited to provide protection from external ionizing radiation. In contrast to the typical goals relating to reduction of weight and size, radiation shielding of unprotected components has traditionally been provided as dedicated housings constructed of high atomic number materials having large mass. Radiation shielding enclosures are typically fabricated from high atomic number metals using specialized stamping, forming, milling, and welding processes which greatly add to the weight and size of the housing. Not only do the radiation attenuating properties of the enclosures require relatively heavy and dense materials, but the enclosures must often allow for design margins due to the lack of availability of precisely sized metal materials with which to construct the enclosures.

What is needed is a method of hardening a system against external ionizing radiation without the need to fabricate dedicated external radiation shields, a process which is both expensive and time consuming.

SUMMARY OF THE INVENTION

The invention is a system and method of making a system comprised of component(s) susceptible to damage or disruption from exposure to ionizing radiation, such as electronic, organic, piezo-electronic, electromagnetic, micro-mechanical, or memory components (collectively "susceptible components") contained within a rigid housing coated with a radiation-attenuating high atomic number metal layer deposited thereon by a thermal spray deposition technique. The housing provides structural protection to the susceptible component while the high atomic number metal layer attenuates external ionizing radiation such that the internal components are protected from external sources of radiation.

The system allows the modification of pre-existing unhardened housings, such as those that may have been provided with the susceptible components from a vendor. In accordance with the invention, the unhardened housings may be coated with the required high atomic number metal material so that a housing of heavy metal material does not need to be fabricated from scratch.

Metallic housings are provided in a wide variety of sizes, shapes, and weights, and metallic housings aboard flight systems such as aircraft, spacecraft, and missiles are almost always designed with weight in mind. The housings are most often constructed from aluminum, or low density metals. The thickness and reinforcement of the housing is dictated by the structural and thermal protection necessary for protection of the susceptible components. The shape of the housing is dictated by the space limitations of the vehicle or other physical location in which the housing resides. Housings that are installed within confined spaces must often be formed into unconventional shapes.

A high atomic number metal coating is applied to the housing with a thermal spray technique. Thermal spray deposition techniques, such as High Velocity Oxygen Fuel (HVOF) and variations of the Plasma Arc Spray (PAS), are methods of projecting metal particles towards a substrate at supersonic velocities in a molten or plastic state such that the particles impact upon a substrate and form a unitary coating layer thereon. Thermal spray has traditionally been used to provide corrosion control and wear resistant coatings.

The inventors have found that thermal spray techniques may be used to apply a high atomic number metal layer, such as tantalum, tungsten, and lead to the exterior surfaces of a pre-existing rigid housing. The high atomic number metal may be applied to the housing as a high density and low porosity coating, which provides excellent attenuation of ionizing radiation.

By using a thermal spray technique to deposit the high atomic number metal upon the pre-existing housing, the coating may be applied more economically than with previous methods of plating. Also, hazardous chemicals associated with plating are eliminated, since the HVOF process only requires oxygen, a fuel that is combusted during the process, and metal powder, which may be recycled if not applied to the housing, and the PAS process only requires a plasma gas, such as argon, nitrogen, hydrogen, or helium, a high-voltage electric current, and metal powder, which may be recycled if not applied to the housing.

Another advantage of using a thermal spray technique to apply the high atomic number metal coating to a pre-existing housing is that a new housing does not have to be fabricated from scratch. The high atomic number metal may be applied directly to the housing regardless of shape, size, or orientation. In the past, if shielding was added to a system of one or more susceptible components, the entire housing would have to be constructed of a high atomic number metal material or of multiple dedicated high atomic number shields. Fabrication of high atomic number metal housings or shields, especially those with unconventional shapes and sizes was both expensive and time consuming.

Also, with the thermal spray process, the high atomic number metal coating may be applied to the precise thickness designed to provide adequate radiation protection without unnecessary weight or bulk from unneeded shielding material.

Thus, the invention provides a time efficient and economical method of coating housings and thereby creating systems, particularly electronic systems, that are effectively shielded from external ionizing radiation.

BRIEF DESCRIPTION OF THE DRAWINGS

Figure 1:
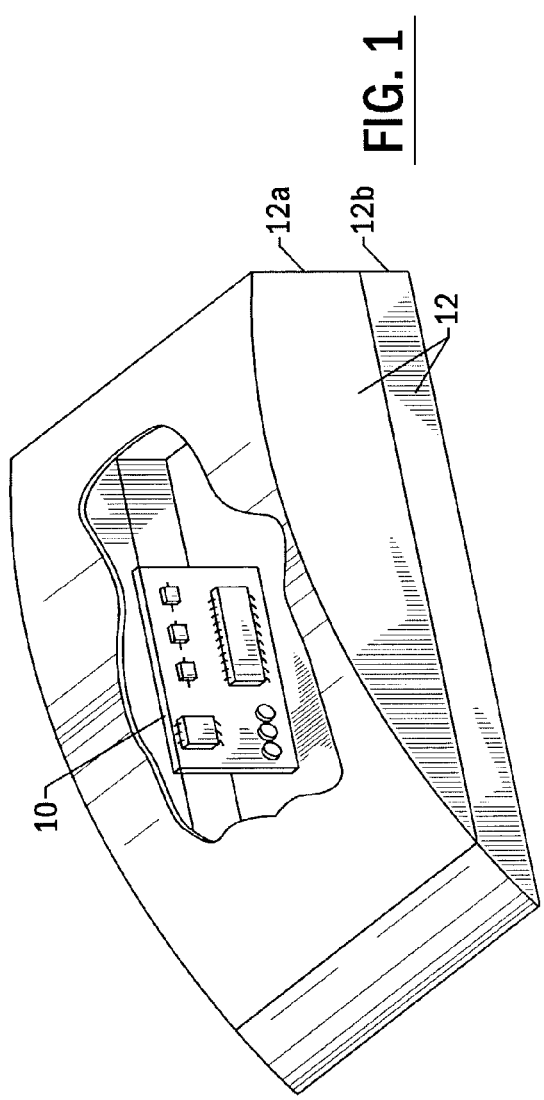
Figure 2:
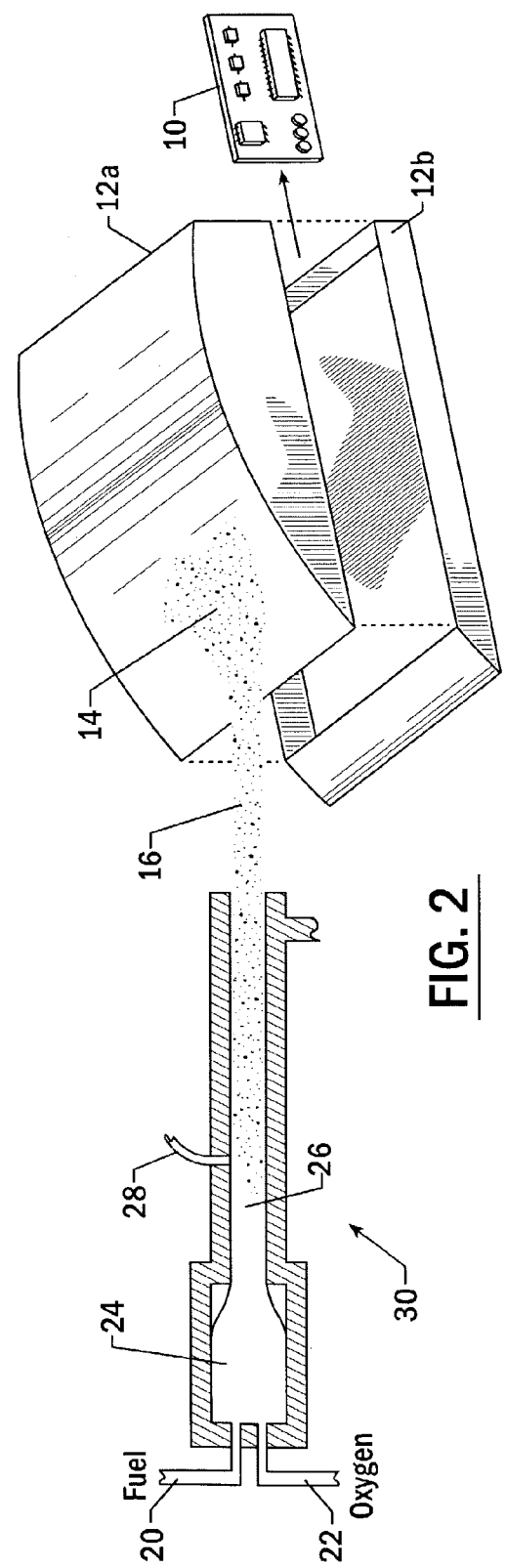
Figure 3:
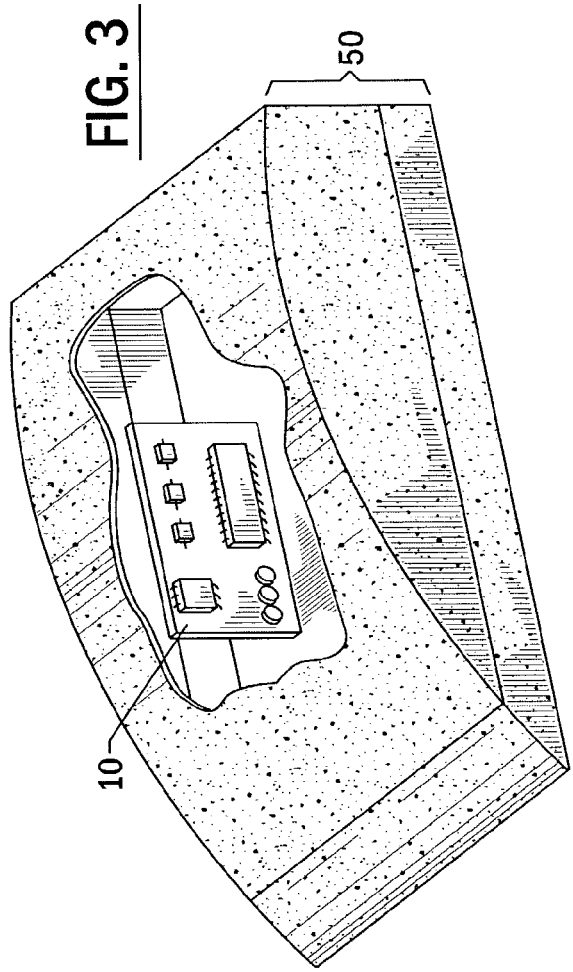
Figure 4:
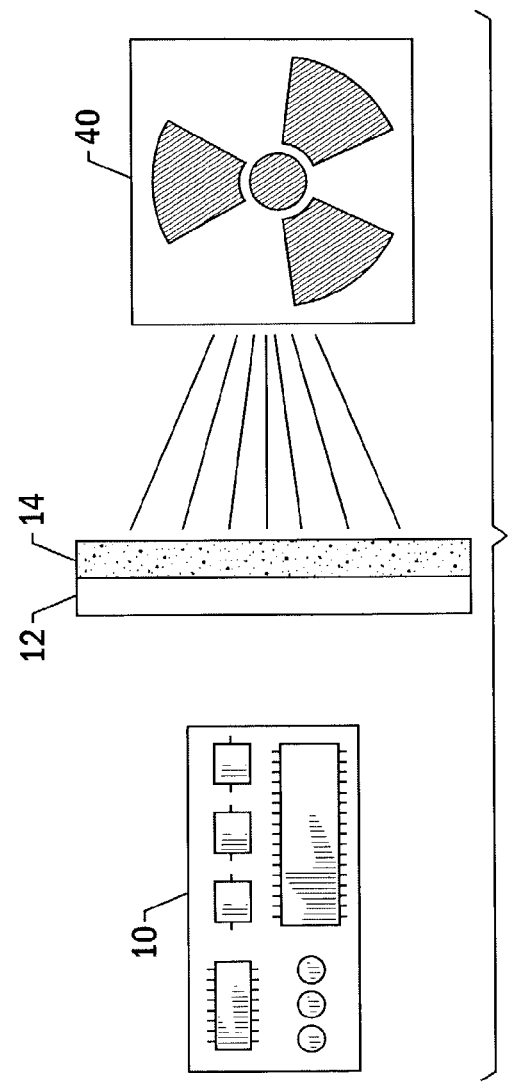
Figure 5:
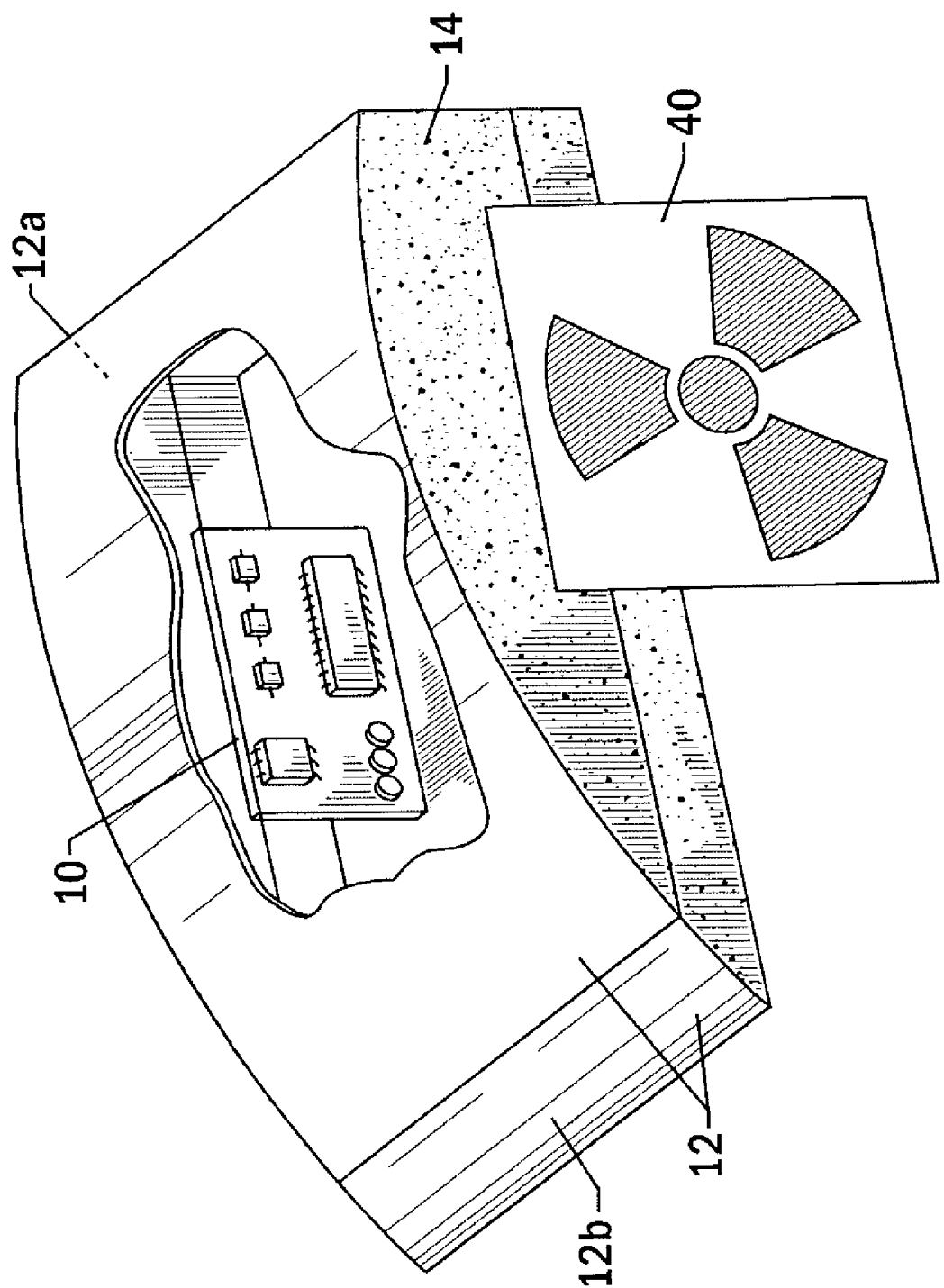

Having thus described the invention in general terms, reference will now be made to the accompanying drawings, which are not necessarily drawn to scale, and wherein:

FIG. 1 is a perspective view of an electronic component within a housing;

FIG. 2 is a perspective view of a thermal spray coating apparatus coating a housing in accordance with an embodiment of the invention;

FIG. 3 is a perspective view of an electronic component within a radiation shielded housing in accordance with an embodiment of the invention;

FIG. 4 is a representation of a radiation-shielded system in accordance with an embodiment of the invention; and FIG. 5 is a representation of an electronic component within a housing having one region of radiation shielding in accordance with an embodiment of the invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring to FIG. 1, a susceptible component 10 is contained within a rigid housing 12, which may optionally be comprised of multiple segments 12a, 12b joined together to form a unitary housing for protection of the susceptible component 10.

For purposes of the detailed description, electronic components are used as exemplary components that may be susceptible to damage or disruption by ionizing radiation. It is to be understood that radiation shielded systems described herein with respect to electronic components are equally applicable to other components susceptible to damage or disruption caused by exposure to ionizing radiation, including but not limited to micro-mechanical devices, piezoelectronic devices, magnetic memory components, optical memory components, electronic memory components, organic memory components, optical devices and living organisms including humans.

An electronic component 10 may be any type of board or panel-type structure with electronic parts and/or electronic, mechanical, electromechanical elements, mounted thereupon, including printed wiring assemblies or boards, transducers, and multifunctional parts with embedded electronics. In general, the invention contemplates electronic components 10 which are designed to perform at least one computational function, and wherein those electronic components are susceptible to interruption of that computational function upon exposure to external ionizing radiation.

The housing 12 may contain multiple electronic components 10 and may also contain components, which are not electronic in nature and which may not be susceptible to disruption by ionizing radiation, such as structural components.

Referring to FIG. 2, a metallic layer 14 is deposited upon the housing 12 using a thermal spray technique. To avoid damage to the electronic components, the high atomic number coating is typically applied prior to installation of the components or after the components have been removed from the housing. If, however, the electronic components 10 are designed to endure the thermal and mechanical conditions associated with environments such as the thermal spray process, it is conceivable that a housing 12 may be satisfactorily coated while the electronics remain within the housing.

The housing is coated using a thermal spray technique which projects particles of high atomic number metals, such as those selected from tantalum, tungsten, platinum, lead, and combinations thereof toward the housing at high velocity in a molten or plastic state. As the metal powders impact the surface of the housing, the metal particles form a unitary metallic coating upon the surface of the housing which is very dense, minimally porous, and of a uniform and precisely controlled thickness.

Several types of thermal spray techniques capable of forming such a coating are industrially available, and are generally described in Davis, J. R., Davis and Associates. Hardfacing, Weld Cladding, and Dissimilar Metal Joining, *ASM Handbook—Welding, Brazing, and Soldering*, Vol. 6. $10^{th}$ ed. OH: ASM Metals Park, 1993. The spray techniques include electric arc spraying (EAS), high velocity oxygen fuel (HVOF), and plasma arc spraying (PAS). Particularly useful techniques for use in coating the housing 12 are the HVOF and PAS techniques because of their ability to produce high-density coatings.

The HVOF process is a flame spray coating deposition process that can apply a dense, very low porosity coating. The controlled thermal output and high gas velocity of an HVOF apparatus imparts both thermal and kinetic energy to the metallic powder particles. One spraying apparatus of this type is disclosed in U.S. Pat. No. 4,999,225 to Rotolico incorporated herein by reference, and is available from the Perkin Elmer Corporation of Norwolk, Conn. Another variation of an HVOF apparatus specifically designed for use in depositing high-density coatings such as those utilized in this invention is disclosed in U.S. Pat. No. 6,245,390 B1. Other HVOF and similar PAS spraying apparatuses of this general type are available in the market place and are known to those of ordinary skill in the art.

Still referring to FIG. 2, in one embodiment, an HVOF thermal spraying apparatus 30 is positioned relative to the surface of a housing 12a, 12b for delivering a spray of metallic particles 16 and thereby creating a metallic coating 14 upon the surface of the housing.

Although variations of thermal spray equipment abound, an exemplary simplified version of an HVOF spray nozzle is shown in FIG. 2 in which fuel 20 such as but not limited to hydrogen, propane, methane, or kerosene, is combined with oxygen 22 and combusted within a combustion chamber 24. The combustion of the fuel creates a supersonic velocity jet of gas, which travels down the length and out of the end of the nozzle 26. Metal particles are projected into the nozzle at an entry point 28 downstream of the combustion chamber 24. Thus, the metallic particles are projected at supersonic velocity toward an object to be coated.

Impact of the metallic particles 16 upon the surface of the housing at supersonic speeds creates a mechanical interlock between the housing and the sprayed coating material. Velocity of the metal particles projected from the nozzle of an HVOF apparatus is typically between one and two times the speed of sound. The high velocity of the malleable impinging particle spray 16 onto the surface of the housing produces a uniform, coating 14 with a near theoretical density of 97–100%.

By using thermal spray techniques, coatings of precise thickness may be applied. The thickness of the coating depends upon the quantity of metallic powder applied to the surface of the housing and the density with which that metal powder is compacted upon the surface. For purposes of proper radiation shielding, it is desired that the coating have a low porosity such that it approaches the theoretical density of the metals and a near zero oxide content. The desired thickness and density of the coating will be predetermined and will be based upon the design characteristics of the electronics contained within the coated housing, the level of radiation expected to be encountered by the housing/electronics, and the radiation shielding previously provided by the underlying housing material.

The advantage of forming a coating having a precise thickness upon a previously existing housing is several fold. First, a new, dedicated, radiation-attenuating housing does not need to be produced in order to provide radiation shielding for the electronic components. Previously, in order to provide shielding, lightweight housings had to be surrounded by dedicated housings capable of protecting the electronics from ionizing radiation. This involved fabricating housings from suitable materials, which was often burdensome and expensive due to the unconventional shapes of the housings. By using the thermal spray process, the old housing, typically constructed from low atomic number metals, may be used as a base material on which to form a thicker, heavier shielding layer of metal.

Also, per unit, it is much more cost effective to coat a preexisting housing than to construct a dedicated radiation-shielding replacement housing. The thermal spray process applies a uniform layer of metal upon the preexisting housing without the need to machine, mold, or otherwise form a dedicated housing from high atomic number materials.

Also, the thermal spray technique is capable of coating materials which may not be combinable using conventional fabricating techniques. The ability to coat housings with coatings of dissimilar materials is tremendously valuable in the production of radiation shields because it allows high atomic number metals such as tungsten to be coated upon lightweight housings constructed of other materials. For example, experiments at Sandia National Laboratories have used HVOF techniques to successfully apply 3400° C. tungsten particles to an aluminum substrate, without melting the aluminum ($T_m$=660° C.).

The housing 12 is typically formed from metal but may be formed from any rigid material capable of withstanding short-term heating of 200° F. or greater. Preferred housing materials include aluminum, aluminum alloys, titanium, titanium alloys, beryllium, beryllium alloys, and any combinations thereof. Such housing materials also include polymeric materials, such as thermoplastics having $T_m$>200° F.

Referring to FIGS. 3 and 4, according to one embodiment of the invention it is contemplated that a uniform coating 14 of high atomic number metal is applied to a housing 12 using the thermal spray technique, after which the susceptible components are installed in the high atomic number coated housing 50. Once enclosed within the coated housing 50, the electronics 10 have improved shielding from external radiation 40, and are capable of withstanding radiation of a predetermined magnitude without interference of the operation of the electronic components. The shielded housing 50 may be installed within the appropriate vehicle or equipment for which it was originally designed, including aircraft, spacecraft, unmanned launch vehicles such as missiles, and space bound satellites. Of course, the system is equally applicable to stationary systems, and mobile land and sea based systems.

The embodiment of FIG. 3 provides radiation shielding from all directions and is applicable to those situations in which the direction of a potential source of radiation is unknown.

As shown in FIG. 5, a region 14 coated with a high atomic number metal layer may be provided on the housing 12 without covering the entire housing 12. If the direction of radiation from a radiation source 40 is previously known, then the high atomic number metal 14 need only be disposed between the source of radiation 40 and those components 10 within the housing that are susceptible to damage or disruption by exposure to the radiation. For instance, it is contemplated that such a housing might be used in a medical environment, such as a hospital, where electronics or other susceptible components might be exposed to x-rays on a regular basis. In such a situation, that portion of a housing could be coated upon the surface of the housing which faces the radiation source without the need to coat the entire housing.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:
1. A radiation shielded system comprising
at least one component susceptible to disruption upon exposure to ionizing radiation;
a rigid housing which substantially surrounds the at least one susceptible component; and, a thermally-sprayed metallic layer deposited on at least a portion of the rigid housing, the metal layer having an actual density of 97% to 100% of the theoretical density of the metal.

2. The shielded system of claim 1, wherein the at least one component susceptible to disruption is selected from, the group consisting of electronic components, living organisms, micro-mechanical devices, piezo-electronic components, magnetic memory systems, optical memory systems, electronic memory systems, organic memory systems, and combinations thereof.

3. The shielded system of claim 2, wherein the at least one component susceptible to disruption is an electronic component.

4. The shielded system of claim 3, wherein the at least one electronic component is designed to perform at least one computational function and wherein the electronic component is susceptible to interruption of the at least one computational function upon exposure to external ionizing radiation.

5. The shielded system of claim 1, wherein the metal tic layer is comprised of a high atomic number metal selected from the group consisting of tantalum, tungsten, lead, and combinations thereof.

6. The shielded system of claim 1, wherein the rigid housing is comprised of a material selected from the group consisting of aluminum, aluminum alloy, titanium, titanium alloy, beryllium, beryllium alloy, plastics, and combinations thereof.

7. The shielded system of claim 1, wherein the metallic layer is deposited using a thermal spray technique selected from the group consisting of High Velocity Oxygen Fuel (HVOF) thermal spray and Plasma Arc Spray (PAS).

8. The shielded system of claim 1, further comprising a source of radiation external to the susceptible component, whereby the radiation is attenuated by the rigid housing and deposited metal layer prior to encountering the susceptible component.

9. The shielded system of claim 1, wherein the shielded system is incorporated into the electronic systems of a vehicle.

10. The shielded system of claim 9, wherein the vehicle is selected from the group consisting of aircraft, spacecraft, land vehicles, aquatic vessels, and missiles.

11. The shielded system of claim 1, wherein the metal layer comprises a unitary metallic coating on the surface of the housing.

12. A shielded electronic system comprising
at least one electronic component; and,
a radiation shield which substantially surrounds the electronic component wherein the radiation shield comprises
a rigid housing; and,
a metallic layer deposited on the surface of the rigid housing having a different composition than the housing, the metallic layer having an actual density of 97% to 100% of the theoretical density of the metal.

13. The shielded system of claim 12, wherein the metallic layer is comprised of a metal selected from the group consisting of tantalum, tungsten, lead, and combinations thereof.

14. The shielded system of claim 12, wherein the rigid housing is comprised of a material selected from the group consisting of aluminum, aluminum alloy, titanium, titanium alloy, beryllium, beryllium alloy, plastics, and combinations thereof.

15. The shielded system of claim 12, further comprising a source of radiation external to the electronic component, whereby the radiation is attenuated by the rigid housing and deposited metal layer prior to encountering the electronic component.

16. The shielded system of claim 12, wherein the shielded system is incorporated into the electronic systems of a vehicle.

17. The shielded system of claim 12, wherein the metallic layer is comprised of a high atomic number metal selected from the group consisting of tantalum, tungsten, lead, and combinations thereof.

18. The shielded system of claim 12, wherein the metallic layer is deposited using a thermal spray technique selected from the group consisting of High Velocity Oxygen Fuel (HVOF) thermal spray and Plasma Arc Spray (PAS).

19. A radiation shielded system comprising
at least one component susceptible to disruption upon exposure to ionizing radiation;
a rigid housing which substantially surrounds the at least one susceptible component; and,
a thermally-sprayed metallic layer deposited on at least a portion of the rigid housing using a thermal spray technique selected from the group consisting of High Velocity Oxygen Fuel (HVOF) thermal spray and Plasma Arc Spray (PAS), the metal layer having an actual density of 97% to 100% of the theoretical density of the metal.

20. The shielded system of claim 19, wherein the at least one component susceptible to disruption is selected the group consisting of electronic components, living organisms, micro-mechanical devices, piezo-electronic components, magnetic memory systems, optical memory systems, electronic memory systems, organic memory systems, and combinations thereof.

21. The shielded system of claim 20, wherein the at least one component susceptible to disruption is an electronic component.

22. The shielded system of claim 21, wherein the at least one electronic component is designed to perform at least one computational function and wherein the electronic component is susceptible to interruption of the at least one computational function upon exposure to external ionizing radiation.

23. The shielded system of claim 19, wherein the metallic layer is comprised of a high atomic number metal selected from the group consisting of tantalum, tungsten, lead, and combinations thereof.

24. The shielded system of claim 19, wherein the rigid housing is comprised of a material selected from the group consisting of aluminum, aluminum alloy, titanium, titanium alloy, beryllium, beryllium alloy, plastics, and combinations thereof.

25. The shielded system of claim 19, further comprising a source of radiation external to the susceptible component, whereby the radiation is attenuated by the rigid housing and deposited metal layer prior to encountering the susceptible component.

26. The shielded system of claim 19, wherein the shielded system is incorporated into the electronic systems of a vehicle.

27. The shielded system of claim 26, wherein the vehicle is selected from the group consisting of aircraft, spacecraft, land vehicles, aquatic vessels, and missiles.

* * * * *

UNITED STATES PATENT AND TRADEMARK OFFICE
CERTIFICATE OF CORRECTION

PATENT NO. : 7,163,752 B2
APPLICATION NO. : 10/325989
DATED : January 16, 2007
INVENTOR(S) : Coker et al.

It is certified that error appears in the above-identified patent and that said Letters Patent is hereby corrected as shown below:

Column 7,

Line 21, "metal tic" should read --metallic--.

Signed and Sealed this

Third Day of April, 2007

JON W. DUDAS
*Director of the United States Patent and Trademark Office*